(12) United States Patent
Ohara et al.

(10) Patent No.: US 7,138,859 B2
(45) Date of Patent: Nov. 21, 2006

(54) SIGNAL PROCESSING DEVICE AND CLASS D AMPLIFIER THAT CAN REDUCE RADIATION NOISE EVEN IF THE NUMBER OF CHANNELS OF A DIGITAL AUDIO SIGNAL INPUTTED THERETO INCREASES

(75) Inventors: Kenichiro Ohara, Tokyo (JP); Masashi Oki, Tokyo (JP)

(73) Assignee: Renesas Technology Corp., Tokyo (JP)

(*) Notice: Subject to any disclaimer, the term of this patent is extended or adjusted under 35 U.S.C. 154(b) by 154 days.

(21) Appl. No.: 10/927,124

(22) Filed: Aug. 27, 2004

(65) Prior Publication Data

US 2005/0046478 A1    Mar. 3, 2005

(30) Foreign Application Priority Data

Aug. 28, 2003 (JP) .............................. 2003-305090

(51) Int. Cl.
*H03F 3/38* (2006.01)
*H03F 3/217* (2006.01)

(52) U.S. Cl. ..................................... 330/10; 330/207 A

(58) Field of Classification Search ................ 330/10, 330/207 A, 251; 375/238, 239; 370/212, 370/213
See application file for complete search history.

(56) References Cited

U.S. PATENT DOCUMENTS 6,473,457 B1* 10/2002 Pascual et al. ............... 375/238
2004/0223545 A1* 11/2004 Lee ............................. 375/238

FOREIGN PATENT DOCUMENTS

JP    2001-223537    8/2001

\* cited by examiner

*Primary Examiner*—Steven J. Mottola
(74) *Attorney, Agent, or Firm*—McDermott Will & Emery LLP

(57) ABSTRACT

A class D amplifier defines different sets of resampled points A and B for channels chA and chB of an input digital audio signal, extracts an interpolation signal of the digital audio signal at the resampled points A and another interpolation signal of the digital audio signal at the resampled points B, and makes a correction to the phase of at least one of the interpolation signals. Thereby, radiation noise can be reduced even if the number of channels of the digital audio signal increases.

4 Claims, 4 Drawing Sheets

SIGNAL PROCESSING DEVICE AND CLASS D AMPLIFIER THAT CAN REDUCE RADIATION NOISE EVEN IF THE NUMBER OF CHANNELS OF A DIGITAL AUDIO SIGNAL INPUTTED THERETO INCREASES

BACKGROUND OF THE INVENTION

1. Field of the Invention

The present invention relates to a signal processing device for creating a pulse modulated signal (for example, a PWM signal or a PDM signal) from a digital audio signal, and a class D amplifier for creating a pulse modulated signal from a digital audio signal and for amplifying the pulse modulated signal.

2. Description of Related Art

A prior art class D amplifier is provided with a driver circuit for amplifying an incoming digital audio signal by switching on two or more transistors (see patent reference 1, for example). In the driver circuit, a large amount of passing through current flows between a power supply and a ground according to the period of the digital audio signal, and radiation noise occurs due to the passing through current. When the digital audio signal has a large number of channels, transistors for different channels may be switched on at the same timing and, in this case, plural corresponding passing through currents are merged and therefore radiation noise increases.

[Patent reference 1] Japanese patent application publication No. 2001-223537 (see paragraph [0014] and FIG. 1)

A problem with a prior art class D amplifier constructed as mentioned above is that since transistors for different channels are switched on at the same timing more frequently as the number of channels of a digital audio signal inputted thereto increases, plural corresponding passing through currents are merged and therefore radiation noise increases.

SUMMARY OF THE INVENTION

The present invention is made in order to solve the above-mentioned problem, and it is therefore an object of the present invention to provide a signal processing device and a class D amplifier that can reduce radiation noise even if the number of channels of a digital audio signal inputted thereto increases.

In accordance with an aspect of the present invention, there is provided a class D amplifier including a defining unit for defining a different set of resampled points for each of two or more incoming signals, an interpolation unit for extracting an interpolation signal at a corresponding set of resampled points defined by the defining unit for each of the two or more incoming signals, a signal creating unit for creating pulse modulated signals from interpolation signals extracted by the interpolation unit, a phase correction unit for making a correction to a phase of at least one of the pulse modulated signal created by the signal creating unit, and an amplification unit for amplifying the pulse modulated signal at least one of which has a phase corrected by the phase correction unit.

Therefore, the class D amplifier can reduce radiation noise even if the number of channels of the signal inputted thereto increases.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1.

Figure 1:
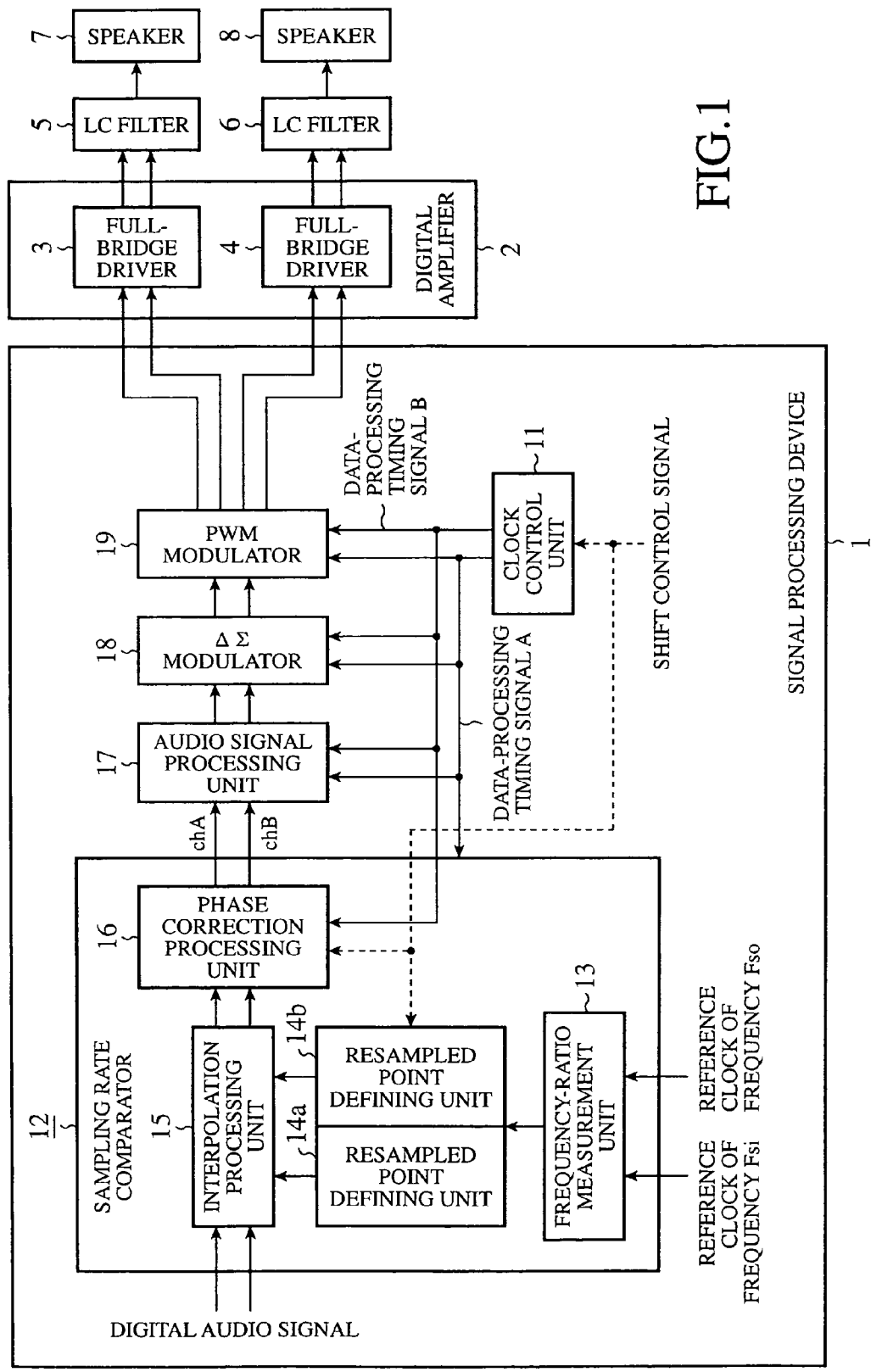
FIG. 1 is a block diagram showing a class D amplifier in accordance with embodiment 1 of the present invention.

FIG. 1 is a block diagram showing a class D amplifier in accordance with embodiment 1 of the present invention. In the figure, a signal processing unit 1 creates PWM signals from an incoming digital audio signal (i.e., an incoming signal). A digital amplifying unit 2 constitutes amplification means, and is provided with first and second full-bridge drivers 3 and 4 each for amplifying a PWM signal created by the signal processing unit 1. LC filters 5 and 6 are low pass filters, each of which consists of an inductor and a capacitor, for converting the PWM signals amplified by the first and second full-bridge drivers 3 and 4 into analog signals, and output them to speakers 7 and 8, respectively.

A clock control unit 11 creates data-processing timing signals A and B according to a shift control signal indicating an amount of shift between two sets of resampled points A and B. A sampling rate converter 12 converts the sampling frequency Fsi of the digital audio signal into a sampling frequency Fso. A frequency-ratio measurement unit 13 measures the frequency ratio of the sampling frequency Fsi to the sampling frequency Fso. A first resampled point defining unit 14a defines a set of resampled points A for a channel chA of the input digital audio signal, and a second resampled point defining unit 14b defines another set of resampled points B for a channel chB of the digital audio signal. Defining means is comprised of the frequency-ratio measurement unit 13 and the first and second resampled point defining units 14a and 14b.

An interpolation processing unit 15 carries out interpolation processing on the channel chA of the digital audio signal so as to extract an interpolation signal A for the channel chA at the resampled points A defined by the first resampled point defining unit 14a, and also carries out interpolation processing on the other channel chB of the digital audio signal so as to extract an interpolation signal B for the channel chB at the resampled points B defined by the second resampled point defining unit 14b. The interpolation processing unit 15 constitutes interpolation means. A phase correction processing unit 16 constitutes phase correction means for making a correction to the phase of the interpolation signal B extracted by the interpolation processing unit 15.

An audio signal processing unit 17 carries out audio signal processing, such as gain control and tone control processes, on the interpolation signals A and B outputted thereto from the phase correction processing unit 16 of the sampling rate converter 12. A ΔΣ modulator 18 carries out ΔΣ modulation on the interpolation signals A and B which have been audio-signal processed by the audio signal processing unit 17, and a PWM modulator 19 creates PWM signals from the interpolation signals A and B which have been ΔΣ-modulated by the ΔΣ modulator 18. Signal creation means is comprised of the ΔΣ modulator 18 and the PWM modulator 19.

Next, the operation of the class D amplifier in accordance with embodiment 1 of the present invention will be explained. The frequency-ratio measurement unit 13 accepts a reference clock having a frequency equal to the sampling frequency Fsi of the incoming digital audio signal (e.g., a PCM signal), which is applied to the sampling rate converter 12, and another reference clock having a frequency equal to the sampling frequency Fso of the digital audio signal, which the sampling rate converter 12 outputs, and then measures the frequency ratio of the sampling frequency Fsi to the sampling frequency Fso (=the reference clock of the sampling frequency Fsi/the reference clock of the sampling frequency Fso).

After the frequency-ratio measurement unit 13 has measured the frequency ratio of the sampling frequency Fsi to the sampling frequency Fso, the first resampled point defining unit 14a adds the measurement value obtained by the frequency-ratio measurement unit 13 to a fixed value, or subtracts this fixed value from the measurement value so as to determine each of the resampled points A for the channel chA.

Each of the resampled points A for the channel chA=the measurement value obtained by the frequency-ratio measurement unit 13±the fixed value When the frequency-ratio measurement unit 13 measures the frequency ratio of the sampling frequency Fsi to the sampling frequency Fso, the second resampled point defining unit 14b calculates the sum of the measurement value obtained by the frequency-ratio measurement unit 13, the above-mentioned fixed value, and an amount of shift (which is indicated by a shift control signal), or subtracts the sum of the above-mentioned fixed value and the above-mentioned amount of shift from the measurement value so as to determine each of the resampled points B for the channel chB.

Each of the resampled points B for the channel chB=the measurement value obtained by the frequency-ratio measurement unit 13±(the fixed value+the amount of shift)

The amount of shift indicated by the shift control signal is set to a register of a microcomputer or the like not shown, for example, and can be programmably changed to an optimal value according to the structure and intended use of the class D amplifier in order to reduce radiation noise. The amount of shift itself varies in units of one system clock cycle (MCK), and can vary from 1×MCK to 2×MCK, . . . , 5×MCK, and . . . . In the case of the use of 2 or more channels, an optimal amount of shift is independently set for every channel.

Figure 2:
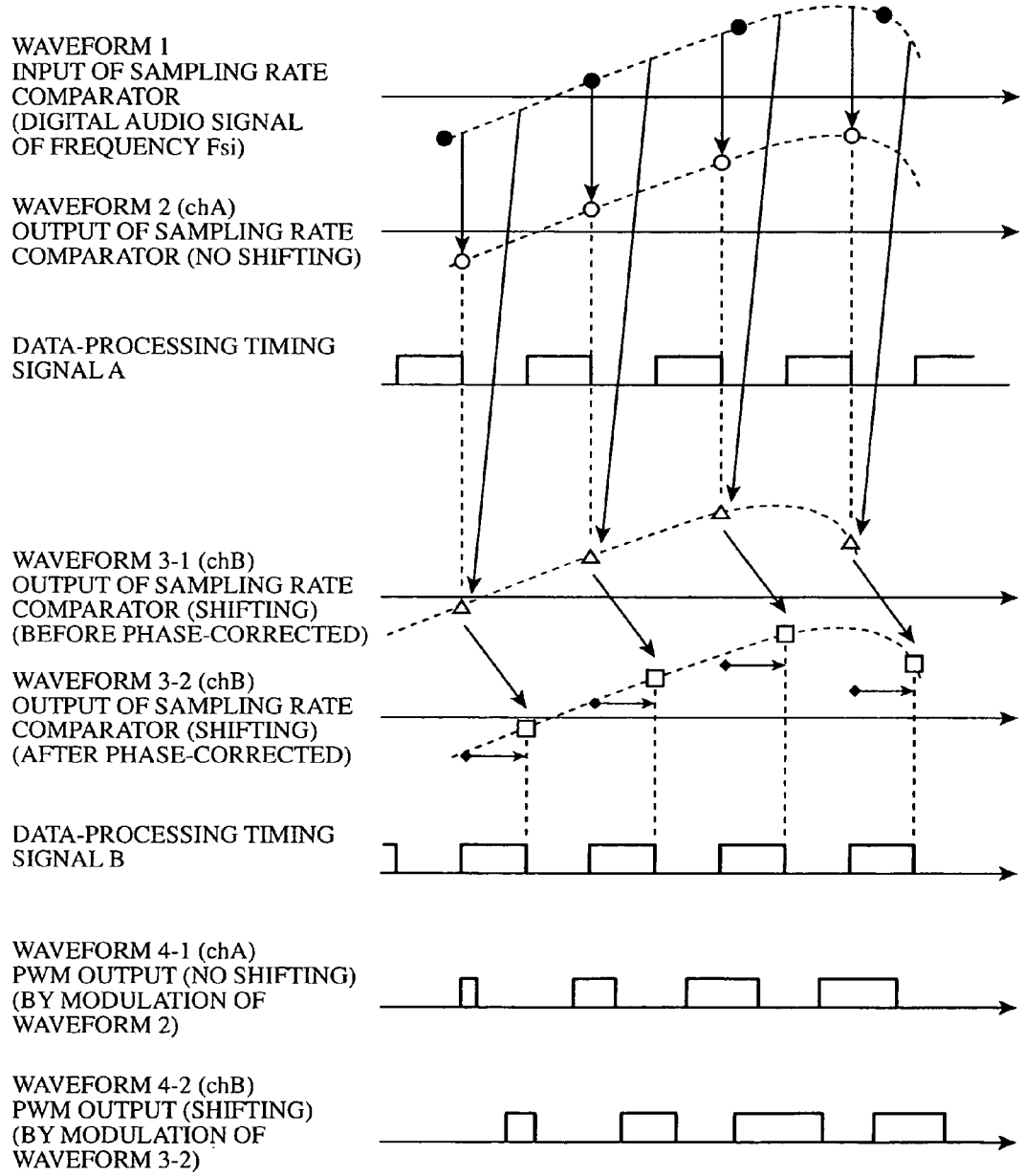
FIG. 2 is an explanatory drawing showing the waveforms of various signals in the class D amplifier in accordance with embodiment 1 of the present invention.

When the first resampled point defining unit 14a defines the resampled points A, the interpolation processing unit 15 carries out interpolation processing on the channel chA of the digital audio signal so as to extract an interpolation signal A for the channel chA at the resampled points A. For example, when the channel chA of the audio signal has a signal waveform 1 as shown in FIG. 2, the interpolation processing unit 15 carries out linear interpolation on points between any two adjacent sampled points marked with "●", for example, so as to extract points marked with "○" corresponding to the resampled points A (see a waveform 2 of FIG. 2). When the second resampled point defining unit 14b defines the resampled points B, the interpolation processing unit 15 carries out interpolation processing on the channel chB of the digital audio signal so as to extract an interpolation signal B for the channel chB at the resampled points B. For example, when the channel chB of the audio signal has the signal waveform 1 as shown in FIG. 2, the interpolation processing unit 15 carries out linear interpolation on points between any two adjacent sampled points marked with "●", for example, so as to extract points marked with "Δ" corresponding to the resampled points B (see a waveform 3-1 of FIG. 2).

When receiving the interpolation signals A and B for the channels chA and chB from the interpolation processing unit 15, the phase correction processing unit 16 makes a phase correction to the interpolation signal B for the channel chB and then outputs the phase-corrected interpolation signal B to the audio signal processing unit 17 while outputting the interpolation signal A to the audio signal processing unit 17 without making a phase correction to the interpolation signal A for the channel chA. In other words, the phase correction processing unit 16 determines an amount of phase correction for the interpolation signal B for the channel chB according to the amount of shift indicated by the shift control signal, and makes a correction to the phase of the interpolation signal B by only the amount of phase correction (see a waveform 3-2 of FIG. 2). As mentioned above, when the phase of the interpolation signal A for the channel chA is not corrected, the amount of phase correction for the interpolation signal B for the channel chB is in agreement with the amount of shift. In the above-mentioned case, the phase correction processing unit 16 makes no phase correction to the interpolation signal A for the channel chA. In accordance with a variant of this embodiment, the phase correction processing unit 16 can also make a phase correction to the interpolation signal A for the channel chA. In this case, the amount of phase correction for the interpolation signal B for the channel chB changes by only the amount of phase correction for the interpolation signal A.

When receiving the interpolation signals A and B for the channels chA and chB from the sampling rate converter 12, the audio signal processing unit 17 carries out audio signal processing, such as gain control and tone control processes, on the interpolation signals A and B. The ΔΣ modulator 18 then carries out ΔΣ modulation on the audio-signal-processed interpolation signals A and B, and the PWM modulator 19 creates PWM signals from the ΔΣ-modulated interpolation signals A and B (see waveforms 4-1 and 4-2 of FIG. 2). Data-processing timings for the interpolation signal A for the channel chA in the audio signal processing unit 17, the ΔΣ modulator 18, and the PWM modulator 19 are times when they receive a data-processing timing signal A created by the clock control unit 11, respectively. Data-processing timings for the interpolation signal B for the channel chB in the audio signal processing unit 17, the ΔΣ modulator 18, and the PWM modulator 19 are times when they receive a data-processing timing signal B created by the clock control unit 11, respectively.

When receiving the PWM signals for the channels chA and chB from the signal processing device 1, the digital amplifying unit 2 amplifies these PWM signals. The LC filters 5 and 6 convert the PWM signals for the channels chA and chB, which are amplified by the first and second full-bridge drivers 3 and 4 of the digital amplifying unit 2, into analog signals, and then output the analog signals to the speakers 7 and 8, respectively.

As can be seen from the above description, in accordance with this embodiment 1, the class D amplifier is so constructed as to define different resampled points A and B for two channels chA and chB of an incoming digital audio signal, extract an interpolation signal of the digital audio signal at the resampled points A and an interpolation signal of the digital audio signal at the resampled points B, and make a phase correction to at least one of the two interpolation signals. Therefore, the present embodiment offers an advantage of being able to reduce radiation noise even if the number of channels of the incoming digital audio signal increases. In other words, since the class D amplifier can shift the operating timing of the channel chA with respect to that of the other channel chB, the class D amplifier can prevent transistors for the channel chA (i.e., transistors which constitute the first full-bridge driver 3) and those for the channel chB (i.e., transistors which constitute the second full-bridge driver 4) from being switched on at the same timing, thereby reducing radiation noise. In accordance with this embodiment 1, as mentioned above, since the class D amplifier prevents the transistors for the channel chA and those for the other channel chB from being switched on at the same timing by shifting the operating timing of the channel chA with respect to that of the other channel chB, and differs from what prevents simultaneous switching operations by simply delaying a signal for one of the two channels, no phase difference occurs between the channels.

In accordance with this embodiment 1, the PWM modulator 19 creates PWM signals from the $\Delta\Sigma$-modulated interpolation signals A and B and outputs the PWM signals to the digital amplifying unit 2, as previously mentioned. As an alternative, the $\Delta\Sigma$ modulator 18 can carry out $\Delta\Sigma$ modulation on the audio-signal-processed interpolation signals A and B so as to create PDM signals, and then output the PDM signals to the digital amplifying unit 2.

Embodiment 2.

Figure 3:
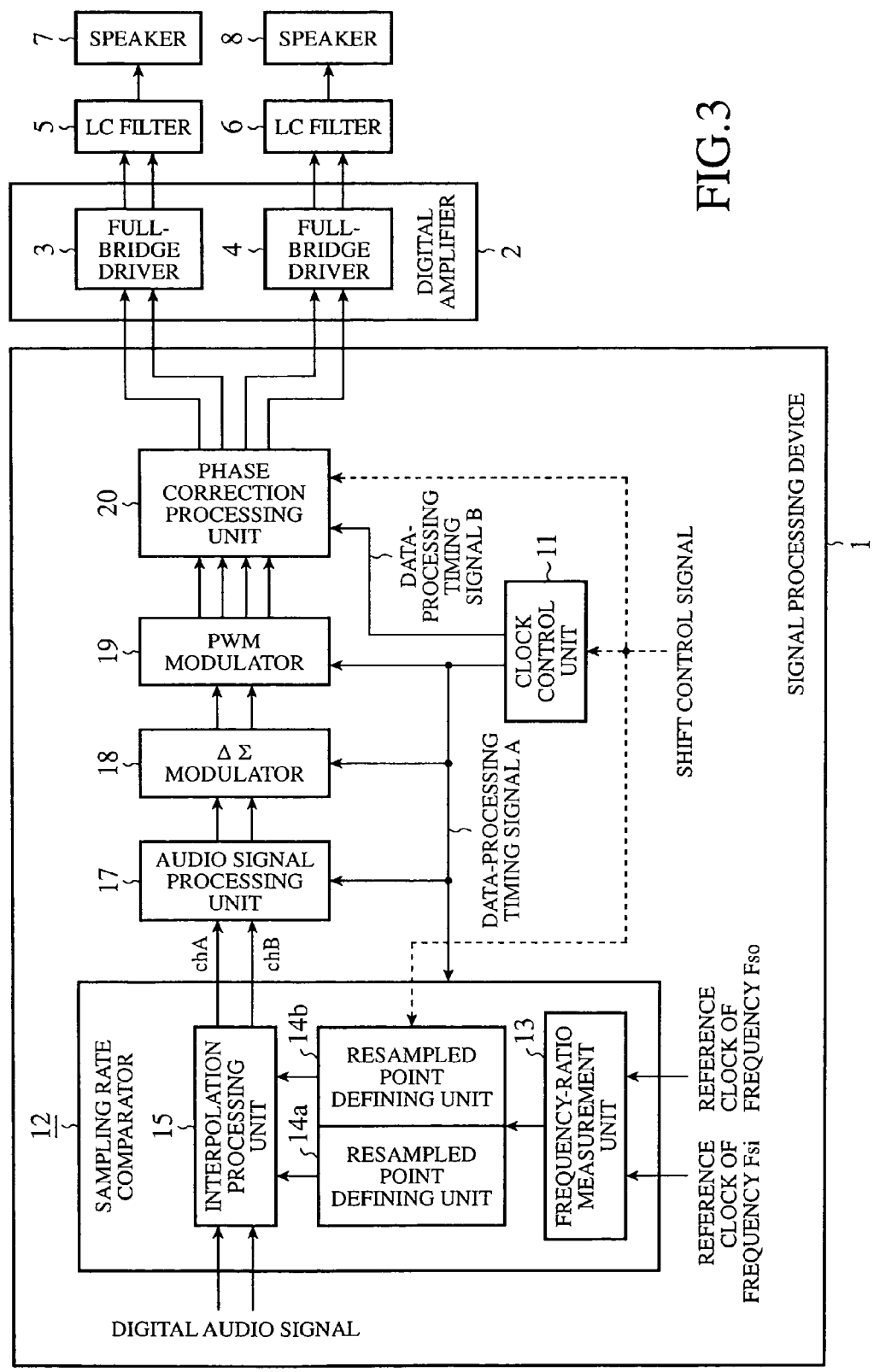
FIG. 3 is a block diagram showing a class D amplifier in accordance with embodiment 2 of the present invention.

FIG. 3 is a block diagram showing a class D amplifier in accordance with embodiment 2 of the present invention. In the figure, the same reference numerals as shown in FIG. 1 denote the same components as those of above-mentioned embodiment 1 or like components, and therefore the explanation of these components will be omitted hereafter. A phase correction processing unit 20 constitutes phase correction means for making a correction to the phase of a PWM signal created by a PWM modulator 19.

In accordance with above-mentioned embodiment 1, the phase correction processing unit 16 makes a correction to the phase of an interpolation signal extracted by an interpolation processing unit 15. In contrast, in accordance with this embodiment, after the PWM modulator 19 has created PWM signals from interpolation signals A and B for two channels chA ad chB, the phase correction processing unit 20 makes a correction to the phase of at least one of the PWM signals. The phase correction processing unit 20 basically carries out correction processing in the same way as the phase correction processing unit 16 of above-mentioned embodiment 1, with the exception that the target signal to be phase-corrected differs from that to be corrected by the phase correction processing unit 16 of above-mentioned embodiment 1.

To be more specific, when receiving the PWM signals for the two channels chA and chB from the PWM modulator 19, the phase correction processing unit 20 makes a phase correction to the PWM signal for the channel chB and outputs the phase-corrected PWM signal to a second full-bridge driver 4 of a digital amplifying unit 2 while outputting the PWM signal for the channel chA to a first full-bridge driver 3 of the digital amplifying unit 2 without making a phase correction to the PWM signal for the channel chA. In other words, the phase correction processing unit 20 determines the amount of phase correction for the interpolation signal B of the channel chB according to the amount of shift indicated by a shift control signal, and makes a correction to the phase of the interpolation signal B by only the determined amount of phase correction. As mentioned above, when the phase of the interpolation signal A for the channel chA is not corrected, the amount of phase correction for the interpolation signal B for the channel chB is in agreement with the amount of shift. In the above-mentioned case, the phase correction processing unit 20 makes no phase correction to the PWM signal for the channel chA. In accordance with a variant of this embodiment, the phase correction processing unit 20 can also make a phase correction to the PWM signal for the channel chA. In this case, the amount of phase correction for the PWM signal for the channel chB changes by only the amount of phase correction for the PWM signal.

Therefore, this embodiment 2 offers an advantage of being able to reduce radiation noise even if the number of channels of the incoming digital audio signal increases, like above-mentioned embodiment 1. In accordance with this embodiment 2, since an audio signal processing unit 17, a $\Delta\Sigma$ modulator 18, and the PWM modulator 19 can carry out data processing on the interpolation signals A and B for the channels A and B at the same timing when receiving a data-processing timing signal A from a clock control unit 11, simplification of the processing can be achieved as compared with above-mentioned embodiment 1. As a result, the circuit scale of the class D amplifier can be further reduced as compared with above-mentioned embodiment 1.

Embodiment 3.

While in accordance with above-mentioned embodiment 1, the phase correction processing unit 16 is disposed back of the interpolation processing unit 15, in accordance with above-mentioned embodiment 2, the phase correction processing unit 20 is disposed back of the PWM modulator 19. In contrast, in accordance with this embodiment, a phase correction processing unit which is the same as the phase correction processing unit 16 or 20 of above-mentioned embodiment 1 or 2 is disposed back of either an audio signal processing unit 17 or a $\Delta\Sigma$ modulator 18. The present embodiment offers the same advantage as provided by above-mentioned embodiment 1 or 2. In general, from the viewpoint of measures against radiation and reduction in the circuit scale, the phase correction processing unit is disposed at the most suitable position.

Embodiment 4.

Figure 4:
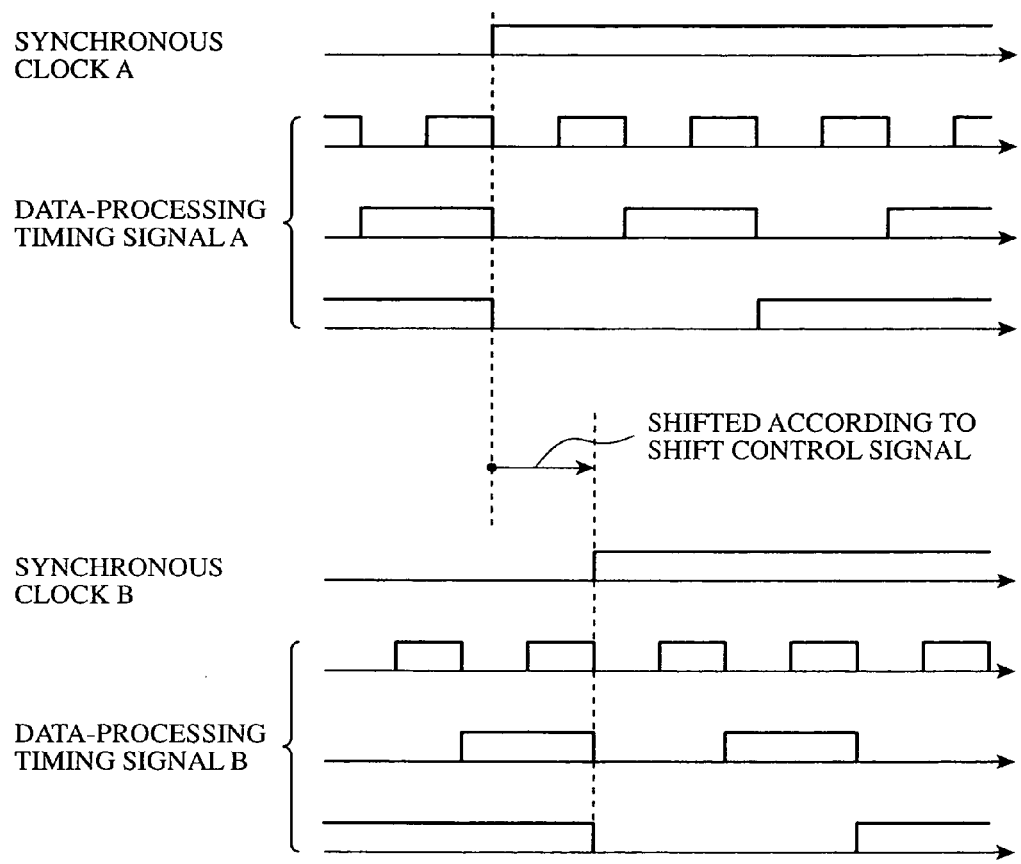
FIG. 4 is an explanatory drawing showing synchronous clocks and data-processing timing signals in a class D amplifier in accordance with embodiment 4 of the present invention.

In above-mentioned embodiments 1 to 3, although no mention is made in particular about the configuration of the clock control unit 11, the clock control unit 11 can be implemented by flip-flops in series. In general, synchronous clocks that are reference signals exist in a class D amplifier that can handle two or more channels. In this case, the same control processing can be implemented by shifting the timing of a synchronous clock used as a reference signal with respect to another synchronous clock (see FIG. 4). In the example of FIG. 4, the class D amplifier creates a data-processing timing signal A in synchronization with a synchronous clock A. According to a shift control signal, the class D amplifier also creates another synchronous clock B which is shifted with respect to the synchronous clock A, and creates another data-processing timing signal B in synchronization with the other synchronous clock B.

Many widely different embodiments of the present invention may be constructed without departing from the spirit and scope of the present invention. It should be understood that the present invention is not limited to the specific embodiments described in the specification, except as defined in the appended claims.

What is claimed is:

1. A class D amplifier comprising:
defining means for defining a different set of resampled points for each of two or more incoming signals;
interpolation means for extracting an interpolation signal at a corresponding set of resampled points defined by said defining means for each of said two or more incoming signals;
phase correction means for making a correction to a phase of at least one of interpolation signals extracted by said interpolation means;
signal creation means for creating pulse modulated signals from the interpolation signals at least one of which has a phase corrected by said phase correction means; and
amplification means for amplifying the pulse modulated signals created by said signal creation means.

2. The class D amplifier according to claim 1, wherein said phase correction means determines an amount of phase correction according to an amount of shift between two or more different sets of resampled points defined for said two or more incoming signals.

3. A class D amplifier comprising:
defining means for defining a different set of resampled points for each of two or more incoming signals;
interpolation means for extracting an interpolation signal at a corresponding set of resampled points defined by said defining means for each of said two or more incoming signals;
signal creation means for creating pulse modulated signals from interpolation signals extracted by said interpolation means;
phase correction means for making a correction to a phase of at least one of the pulse modulated signal created by said signal creation means; and
amplification means for amplifying the pulse modulated signal at least one of which has a phase corrected by said phase correction means.

4. The class D amplifier according to claim 3, wherein said phase correction means determines an amount of phase correction according to an amount of shift between two or more different sets of resampled points defined for said two or more incoming signals.

* * * * *